(12) United States Patent
Abe et al.

(10) Patent No.: US 9,691,950 B2
(45) Date of Patent: Jun. 27, 2017

(54) LIGHT EMITTING DEVICE AND METHOD OF MANUFACTURING LIGHT EMITTING DEVICE

(71) Applicant: NICHIA CORPORATION, Anan-shi, Tokushima (JP)

(72) Inventors: Koji Abe, Anan (JP); Masafumi Kuramoto, Anan (JP); Masaki Hayashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/339,534

(22) Filed: Jul. 24, 2014

(65) Prior Publication Data

US 2015/0028373 A1    Jan. 29, 2015

(30) Foreign Application Priority Data

Jul. 25, 2013  (JP) ................................ 2013-155013

(51) Int. Cl.
*H01L 33/00*     (2010.01)
*H01L 33/56*     (2010.01)
(Continued)

(52) U.S. Cl.
CPC ........ *H01L 33/56* (2013.01); *H01L 21/02565* (2013.01); *H01L 21/02601* (2013.01); *H01L 23/28* (2013.01); *H01L 27/322* (2013.01); *H01L 33/50* (2013.01); *H01L 33/52* (2013.01); *H01L 51/5268* (2013.01); *H01L 51/5275* (2013.01); *H01L 2224/32245* (2013.01);
(Continued)

(58) Field of Classification Search
CPC . H01L 21/84; H01L 27/108; H01L 27/10802; H01L 27/10844; H01L 27/1203; H01L 29/66666; H01L 29/7841; H01L 33/50; H01L 27/322; H01L 21/02565; H01L 21/02601; H01L 23/28; H01L 2933/0091; H01L 33/52; H01L 51/5268; H01L 51/5275
USPC .......................................................... 257/98
See application file for complete search history.

(56) References Cited

U.S. PATENT DOCUMENTS

| 2002/0039001 A1 | 4/2002 | Nagai et al. |
| 2004/0046222 A1 | 3/2004 | Nagai et al. |

(Continued)

FOREIGN PATENT DOCUMENTS

| JP | 2003-086846 A | 3/2003 |
| JP | 2005-197317 A | 7/2005 |

(Continued)

*Primary Examiner* — Tod T Van Roy
*Assistant Examiner* — Vu A Vu
(74) *Attorney, Agent, or Firm* — Global IP Counselors, LLP

(57) ABSTRACT

A light emitting device includes a light emitting element configured to emit visible light; a fluorescent substance excited by light from the light emitting element and configured to emit visible light; a translucent member containing a translucent base material, which provided on the fluorescent substance or configured to contain the fluorescent substance, and provided on the light emitting element; and a film provided on an upper surface of the translucent member, and configured as an agglutination of nanoparticles having a different refractive index from the base material.

19 Claims, 6 Drawing Sheets

(51) Int. Cl.
*H01L 27/32* (2006.01)
*H01L 33/50* (2010.01)
*H01L 33/52* (2010.01)
*H01L 21/02* (2006.01)
*H01L 51/52* (2006.01)
*H01L 23/28* (2006.01)

(52) U.S. Cl.
CPC .............. *H01L 2224/48247* (2013.01); *H01L 2224/48257* (2013.01); *H01L 2224/73265* (2013.01); *H01L 2933/0091* (2013.01)

(56) References Cited

U.S. PATENT DOCUMENTS

| | | |
|---|---|---|
| 2004/0241894 A1 | 12/2004 | Nagai et al. |
| 2006/0099449 A1* | 5/2006 | Amano et al. ................ 428/690 |
| 2006/0234409 A1 | 10/2006 | Nagai et al. |
| 2007/0018102 A1 | 1/2007 | Braune et al. |
| 2009/0134415 A1 | 5/2009 | Morioka |
| 2009/0146171 A1 | 6/2009 | Okubo |
| 2010/0110551 A1* | 5/2010 | Lamansky et al. ........... 359/599 |
| 2011/0018026 A1 | 1/2011 | Konno et al. |
| 2011/0133218 A1 | 6/2011 | Lee |
| 2011/0140150 A1* | 6/2011 | Shum ............................ 257/98 |
| 2012/0106125 A1* | 5/2012 | Yokotani ................ F21S 4/008 362/84 |
| 2012/0161621 A1 | 6/2012 | Sato |
| 2012/0245253 A1* | 9/2012 | Schultz .................... C08K 3/26 523/435 |
| 2012/0300450 A1* | 11/2012 | Yamamoto .................... 362/231 |
| 2014/0191648 A1* | 7/2014 | Lin ......................... F21K 9/135 313/116 |

FOREIGN PATENT DOCUMENTS

| | | |
|---|---|---|
| JP | 2007-507089 A | 3/2007 |
| JP | 2008-226909 A | 9/2008 |
| JP | 2009-130301 A | 6/2009 |
| JP | 2009-141051 A | 6/2009 |
| JP | 2009-260244 A | 11/2009 |
| JP | 2010-016029 A | 1/2010 |
| JP | 2010-192829 A | 9/2010 |
| JP | 2011-119739 A | 6/2011 |
| JP | 2012-151466 A | 8/2012 |

* cited by examiner

LIGHT EMITTING DEVICE AND METHOD OF MANUFACTURING LIGHT EMITTING DEVICE

CROSS-REFERENCE TO RELATED APPLICATIONS

This application claims priority to Japanese Patent Application No. 2013-155013 filed on Jul. 25, 2013. The entire disclosure of Japanese Patent Application No. 2013-155013 is hereby incorporated herein by reference.

BACKGROUND

Technical Field

The present disclosure relates to a light emitting device and a method of manufacturing the light emitting device, and particularly to a light emitting device having a light emitting element and a method of manufacturing the same.

Related Art

In recent years, light emitting devices such as light emitting diodes or the like include a light emitting element that is configured to emit a primary light and a fluorescent substance that is configured to be excited by the primary light and thereby emit a secondary light having a wavelength that is different from the primary light. Another configuration of a light emitting device is provided with a plurality of light emitting elements having different light emission colors such as red light, green light, blue light, or the like.

Manufacturing processes for such light emitting devices result in a deviation in the light emission chromaticity as a result in a deviation or the like in the content or particle diameter of the fluorescent substance, or a deviation in the light emission wavelength of the light emission element. A product that does not comply with a prescribed range of light emission chromaticity is not normally of commercial value.

For example, JP2009-141051A discloses color adjustment of a light emission color of a light emitting diode device by mixing minute particles, having an average particle diameter of 1 to 20 microns and including one of pigment particles, particles colored by staining, and fluorescent particles, either in isolation or with minute particles that are not colored and attaching the mixture to substantially the whole surface of the surface of a silicon resin configured to seal a light emitting diode element.

SUMMARY

The present invention is proposed in relation to the problems above, and has the object of providing a light emitting device that adjusts light emission chromaticity by use of a different principle to the principle used in the prior art, and to a manufacturing method for a light emitting device that adjusts light emission chromaticity by use of a different principle to the principle used in the prior art because the light emitting diode device fails to exhibit an effect of adjusting the color of emitted light unless the minute particles attached to substantially the whole surface of the sealing resin surface of the silicon resin includes one of pigment particles, particles colored by staining, or fluorescent particles.

The present disclosure relates to a light emitting device. The light emitting device includes:

a light emitting element configured to emit visible light;
a fluorescent substance excited by light from the light emitting element and configured to emit visible light;
a translucent member containing a translucent base material, which provided on the fluorescent substance or configured to contain the fluorescent substance, and provided on the light emitting element; and
a film provided on an upper surface of the translucent member, and configured as an agglutination of nanoparticles having a different refractive index from the base material.

Further, the present disclosure relates to a light emitting device. The light emitting device includes:

a plurality of light emitting elements respectively configured to emit different colors of light;
a translucent member containing a translucent base material, and provided on the plurality of light emitting elements; and
a film provided on an upper surface of the translucent member, and configured as an agglutination of nanoparticles having a different refractive index from the base material.

The present disclosure relates to a method of manufacturing the light emitting device. Here, the light emitting device includes:

a light emitting element configured to emit visible light;
a fluorescent substance excited by light from the light emitting element and configured to emit visible light,
a translucent member containing a translucent base material, which provided on the fluorescent substance or configured to contain the fluorescent substance, and provided on the light emitting element. The method includes:

forming a film on an upper surface of the translucent member, the film configured as an agglutination of nanoparticles having a different refractive index from the base material.

Moreover, the present disclosure relates to a method of manufacturing the light emitting device. Here, the light emitting device includes:

a plurality of light emitting elements respectively configured to emit different colors of light;
a translucent member containing a translucent base material, and provided on the plurality of light emitting elements. The method includes:

forming a film on an upper surface of the translucent member, the film configured as an agglutination of nanoparticles having a different refractive index from the base material.

The above light emitting device can be configured for suitable adjustment of a light emission chromaticity, and the above manufacturing method for the light emitting device enables manufacture of a light emitting device that is enabled for suitable adjustment of a light emission chromaticity.

DETAILED DESCRIPTION

Embodiments for implementing the light emitting device of the present invention will be described below with reference to the accompanying drawings. In the following embodiment of the light emitting device and the method of manufacturing the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments. The sizes and the arrangement relationships of the members in each of drawings are occasionally shown exaggerated for ease of explanation.

First Embodiment

FIG. 1(a) is a schematic upper view of a light emitting device according to a first embodiment, and 1(b) is a schematic sectional view along the sectional face A-A.

Figure 1:
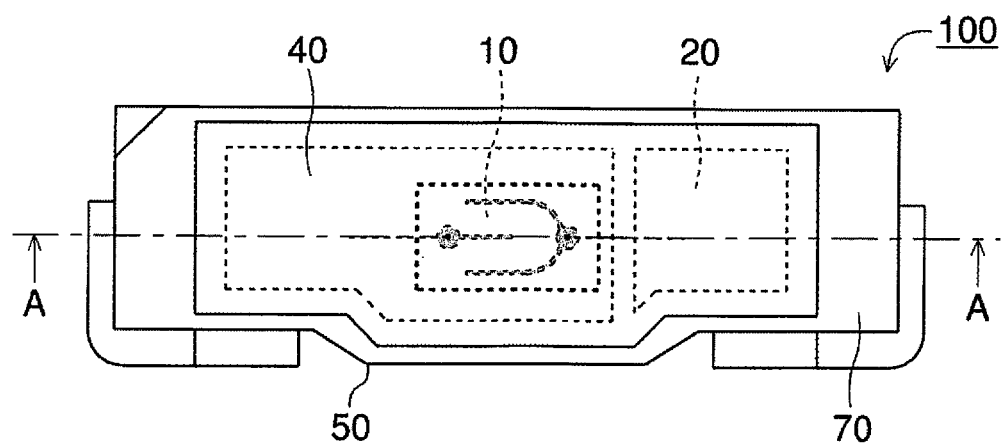
FIG. 1(*a*) is a schematic upper view of a light emitting device according to a first embodiment of the present invention, and 1(*b*) is a schematic sectional view along the sectional face A-A.
Figure 1:
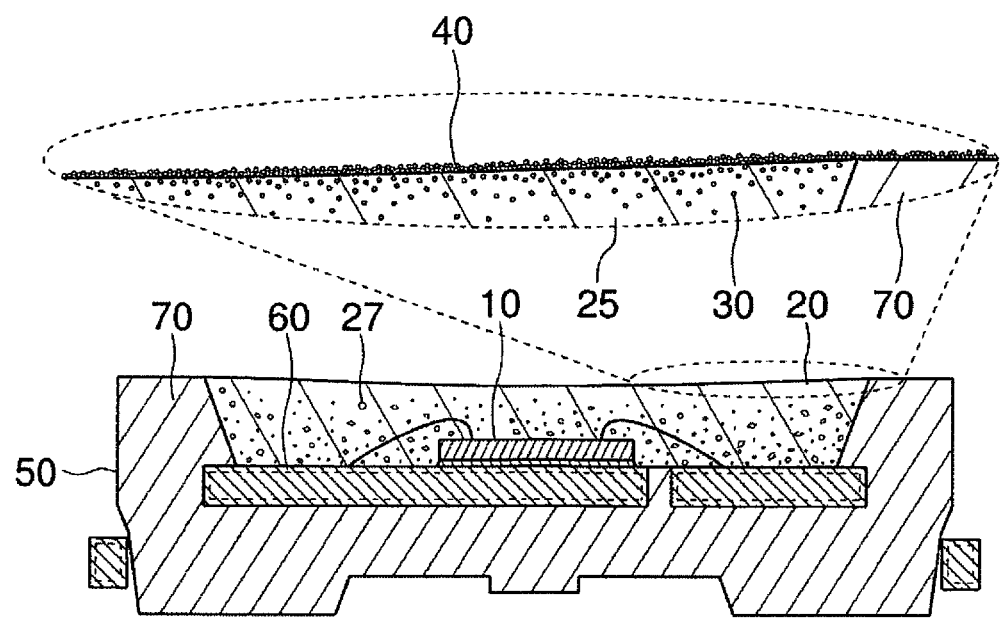

As illustrated in FIG. 1, the light emitting device 100 includes a light emitting element 10, a translucent member 20, and a film 40. Furthermore, the light emitting device 100 includes a mounting base 50 configured to mount the light emitting element 10. The mounting base 50 includes an enclosure body 70. The light emitting element 10 emits visible light. The translucent member 20 includes a translucent base material 25. The translucent member 20 includes a fluorescent substance 27, and is provided on the light emitting element 10. The fluorescent substance 27 emits visible light when excited by light emitted from the light emitting element 10. The film 40 is provided on the upper surface of the translucent member 20. The film 40 is configured as an agglutination of nanoparticles 30 that exhibit a different refractive index from the base material 25 of the translucent member.

More specifically, the mounting base 50 is configured as a package in which a pair of anode and cathode lead frames is integrally retained by the enclosure body 70 that is configured as a resin molded body. The light emitting element 10 is accommodated in a recessed portion of the enclosure body 70. The light emitting element 10 is adhered onto one of the lead frames and is connected by a wire with both of the lead frames. The translucent member 20 fills the recessed portion of the enclosure body 70 to thereby cover the light emitting element 10. The base material 25 of the translucent member is configured as a cured resin.

The term "nanoparticles" in the specification, for example, means particles having so-called nanoparticles, which usually has a particle diameter of about 1 nm to 100 nm. Therefore, the nanoparticles of the present disclosure can include particles other than particles having the particle diameter of about 1 nm to 100 nm. For example, the nanoparticles can include particles having a particle diameter of at most 100 micron, and preferably having a particle diameter of about 1 nm to 10 micron, and more preferably having a particle diameter of about 1 nm to a few hundreds nm. Furthermore, the "particle diameter" of the nanoparticles can be defined as an average particle diameter or a central particle diameter. More specifically, a primary particle diameter can be measured by use of microscope observation, a BET method, or the like, and a secondary particle diameter can be measured by a dynamic light scattering method, a diffusion method, diffractometry, or the like.

(Adjustment Principle of Light Emission Chromaticity)

This type of light emitting device 100 is configured to suitably adjust light emission chromaticity by the principle described below.

Figure 2:
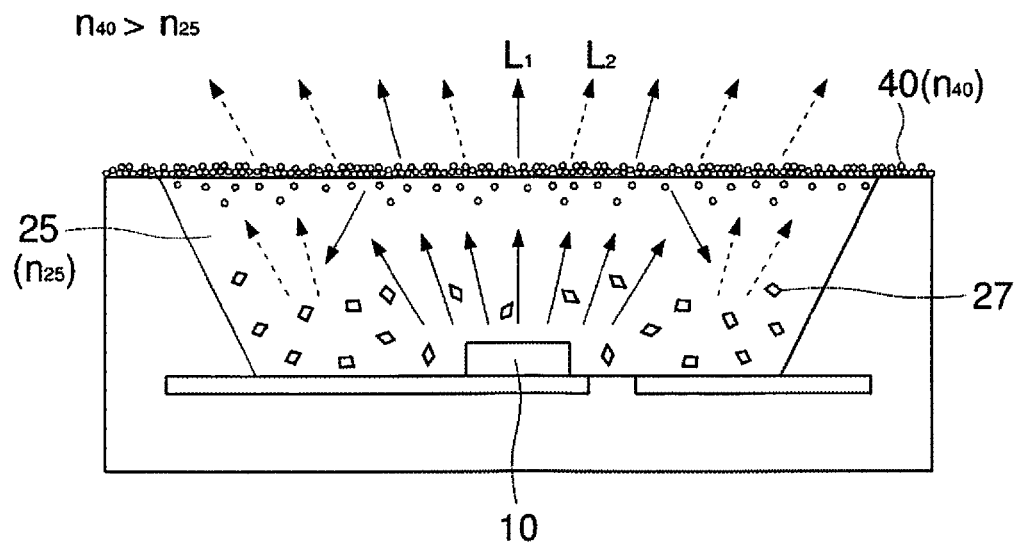
FIGS. 2(*a*) and 2(*b*) are schematic views describing the principle of adjusting a light emission chromaticity of the light emitting device according to the first embodiment of the present invention.
Figure 2:
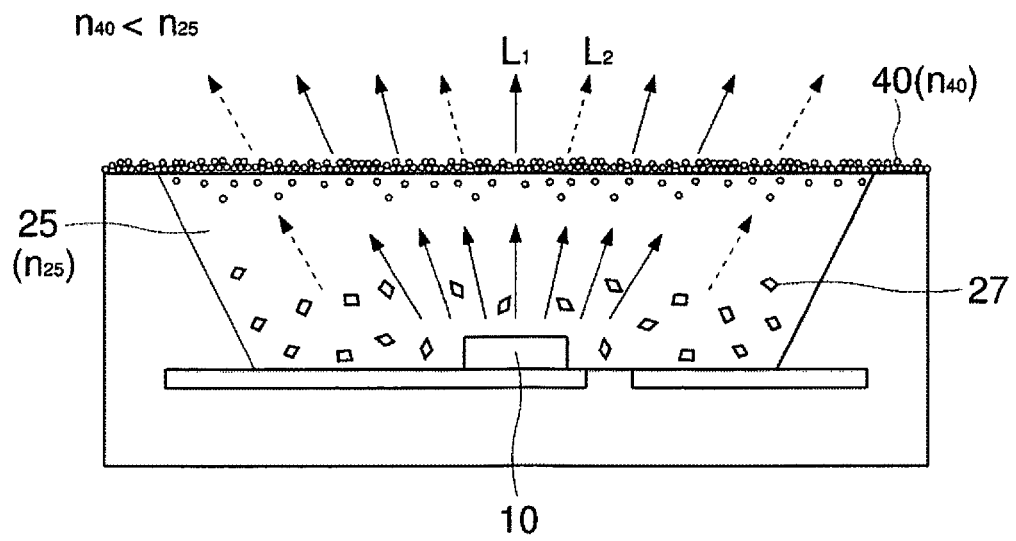

FIGS. 2(a) and 2(b) are schematic views describing the principle of adjusting a light emission chromaticity of the light emitting device according to the first embodiment. Firstly, as illustrated in FIG. 2(a), when the refractive index $n_{40}$ of the film 40 is greater than the refractive index $n_{25}$ of the base material 25 of the translucent member, the reflected light component of the primary light $L_1$ in the interface between the film 40 and the air becomes greater than that in the interface between the air and the base material 25 of the translucent member. Furthermore, a part of the reflected light component of the primary light $L_1$ that returns into the translucent member 20 is converted into secondary light $L_2$ by the fluorescent substance 27. The secondary light $L_2$ has a longer wavelength than the primary light $L_1$ and therefore passes more easily through the film 40 than the primary light $L_1$. Consequently, light that is emitted from the light emitting device 100 exhibits a relatively high proportion of secondary light $L_2$ in comparison to primary light $L_1$, and therefore the light emission chromaticity can be adjusted toward a longer wavelength. On the other hand, as illustrated in FIG. 2(b), when the refractive index $n_{40}$ of the film 40 is smaller than the refractive index $n_{25}$ of the base material 25 of the translucent member, the reflected light component of the primary light $L_1$ in the interface between the film 40 and the air becomes smaller than that in the interface between the air and the base material 25 of the translucent member. In this manner, the proportion of primary light $L_1$ that passes through the film 40 is increased, and the conversion of the primary light $L_1$ into secondary light $L_2$ by the fluorescent substance 27 is reduced. Consequently, light that is emitted from the light emitting device 100 exhibits a relatively high proportion of primary light $L_1$ in comparison to secondary light $L_2$, and therefore the light emission chromaticity can be adjusted toward a shorter wavelength.

High adhesive properties of the film 40 onto the upper surface of the translucent member 20 are obtained when the film 40 is configured by nanoparticles 30, and a high extraction efficiency of light can be maintained by inhibiting reflection or scattering of light by the particles.

(Manufacturing Method of Light Emitting Device)

FIGS. 3(a) and 3(b) are schematic views describing an example of a method of manufacturing the light emitting device according to the first embodiment. The manufacturing method of the light emitting device 100 includes a step of forming the film 40, that is configured as an agglutination of nanoparticles that exhibit a different refractive index from the base material 25 of the translucent member, onto an upper surface of the translucent member 30 (film forming step). Hereinafter a transitory configuration during the processing steps for manufacture of the light emitting device 100 referred to as a work in process of the light emitting device 99, for example, the work in process of the light emitting device 99 includes the final step of sealing of the light emitting element 10 (in the present embodiment, the formation of the translucent member 20 onto the light emitting element 10).

Figure 3:
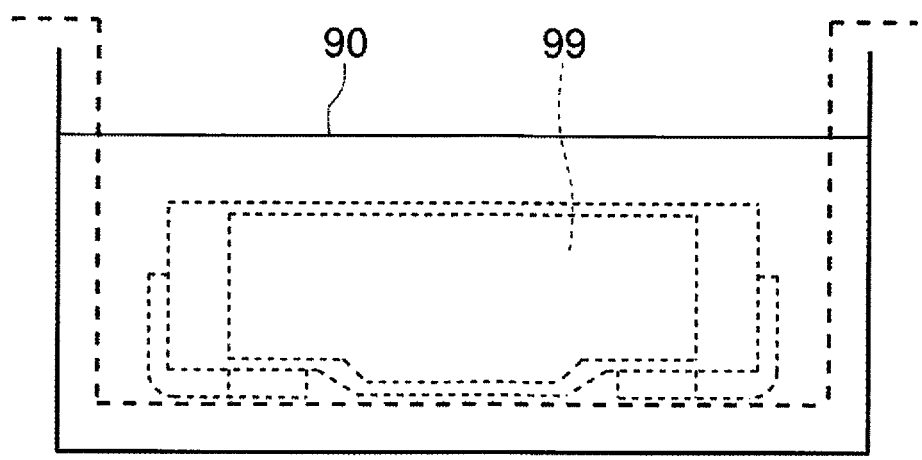
FIGS. 3(*a*) and 3(*b*) are schematic views describing an example of a method of manufacturing the light emitting device according to the first embodiment of the present invention.
Figure 3:
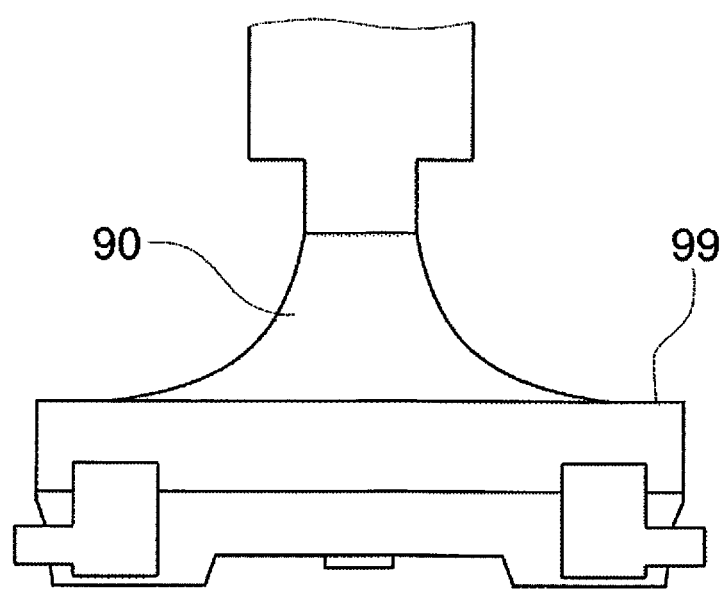

In the film forming step, for example as illustrated in FIG. 3(*a*), the film 40 can be formed by immersion of the upper surface of the translucent member 20 into a fluid dispersion 90 in which nanoparticles 30 are dispersed into a resin or volatile liquid. In this manner, the film 40 can be simply formed onto the upper surface of the translucent member 20, and thereby efficient productivity is enabled in relation to light emission chromaticity adjustment of the light emitting device 100. Although the immersion into the fluid dispersion 90 can be performed in relation to at least the upper surface of the translucent member 20, as illustrated in the figures, immersion can be performed of the whole of the work in process of the light emitting device 99 into the fluid dispersion 90. Furthermore, when the light emitting device 100 includes the enclosure body 70 that is configured to enclose the periphery of the translucent member 20 and the light emitting element 10, it is preferred that the enclosure body 70 is immersed into the fluid dispersion 90. In this manner, the film 40 can also be provided on the enclosure body 70.

In the film forming step, for example as illustrated in FIG. 3(*b*), the film 40 can be formed by coating the fluid dispersion 90 in which nanoparticles 30 are dispersed into a resin or volatile liquid, onto the upper surface of the translucent member 20. In this manner, efficient control is enabled of the formation of the film 40 onto the upper surface of the translucent member 20, and accurate adjustment of the light emission chromaticity of the light emitting device 100 can be realized. A specific method of coating the fluid dispersion 90 onto the upper surface of the translucent member 20 can be configured by blowing by spraying or injecting, potting by use of a dispenser, or applying by use of a brush or sponge, or the like.

When the nanoparticles 30 are dispersed into the resin, the resin is preferably provided in an amount that does not impede the conductive properties of the conductive member (lead frame, wiring, projecting electrode, or the like). Furthermore, when the light emitting device 100 includes an enclosure body 70 that is configured to enclose the periphery of the translucent member 20 and the light emitting element 10, it is preferred that the fluid dispersion 90 is coated also onto the enclosure body 70. In this manner, the film 40 can also be provided onto the enclosure body 70.

It is preferred that the film 40 is formed after provision of the translucent member 20 onto the light emitting element 10. In this manner, adjustment of the light emission chromaticity in relation to the entire light emitting device 100 (composite body of elements configured to emit light) can be facilitated, and it is possible to simplify the adjustment of the light emission chromaticity. Conversely, the film 40 can be formed prior to provision of the translucent member 20 onto the light emitting element 10. In this configuration, since the film 40 is formed separately from the translucent member 20, formation of the film 40 into an unintended position on the light emitting device 100 can be avoided.

Before the film 40 formation step, it is preferred that a step is provided that is configured for measurement of the chromaticity of the light emitted from the translucent member 20 (light emission chromaticity pre-measurement step). In this manner, adjustment of the light emission chromaticity of the light emitting device 100 to a desired value is facilitated. Furthermore, it is preferred that the content of nanoparticles 30 in the light emitting device 100, and in particular in the film 40 and the translucent member 20 is determined based on a difference between a desired chromaticity and the measured chromaticity (in the light emission chromaticity pre-measurement step). In this manner, accurate adjustment of the light emission chromaticity of the light emitting device 100 can be realized. When immersing into the fluid dispersion 90, the content of the nanoparticles 30 in the light emitting device 100 can be controlled by the concentration of the fluid dispersion 90, the immersion time, or the like, and when coating the fluid dispersion 90, control is enabled with reference to the concentration of the fluid dispersion 90 and/or the number of coating operations, or the like.

(Light Emitting Device)

A preferred light emitting device 100 will be described below.

As illustrated in FIG. 1, in the light emitting device 100, the nanoparticles 30 are impregnated into the base material 25 of the translucent member. More specifically, the nanoparticles 30 are impregnated onto the upper surface side in the base material 25 of the translucent member. This type of configuration for example enables impregnation of the nanoparticles 30 from the upper surface side of the translucent member 20 into the base material 25. Therefore, supplement of adjustment function of the light emission chromaticity from the film 40 is enabled by the nanoparticles 30 that are in the base material 25 of the translucent member. This feature is thought to result from the dispersal of light resulting and/or the change in the effective refractive index of the translucent member 20 by the presence of the nanoparticles 30.

The particle diameter of the nanoparticles 30 can be configured to cause Rayleigh scattering of light (primary light) from the light emitting element 10 (at least one of those elements when there is a plurality of light emitting elements). More specifically, a particle diameter that is configured to cause Rayleigh scattering of the nanoparticles 30 can be defined for example as a particle diameter of no more than $\frac{1}{10}$ of the light wavelength. A tendency is exhibited wherein scattering by the particles is facilitated as the wavelength becomes shorter. That is to say, the primary light from the light emitting element that exhibits a comparatively short wavelength tends to be scattered by the particles, and the secondary light from the fluorescent substance that exhibits a comparatively long wavelength tends to pass through the particles. In particular, that trend becomes conspicuous when the particle diameter of the nanoparticles 30 is a particle diameter than obtains Rayleigh scattering. Therefore, that arrangement configures selective control to enable scattering of short wavelength light by the nanoparticles 30, and to enable long wavelength light to pass through the nanoparticles 30. In particular, when the refractive index of the nanoparticles 30 is greater than the refractive index of the base material 25 of the translucent member, the scattering intensity of light by the nanoparticles 30 can be increased. In this manner, the adjustment amount in relation to the light emission chromaticity of the light emitting device 100 can be increased.

When the refractive index of the nanoparticles 30 is greater than the refractive index of the base material 25 of the translucent member, as discussed above, the refractive index of the film 40 is greater than the refractive index of the base material 25 of the translucent member, and therefore, it is possible to adjust the light emission chromaticity of the light emitting device 100 towards a longer wavelength. In this configuration, the nanoparticles 30 for example can be configured to use of a titanium oxide. Conversely, when the refractive index of the nanoparticles 30 is smaller than the refractive index of the base material 25 of the translucent member, as discussed above, the refractive index of the film 40 is smaller than the refractive index of the base material 25 of the translucent member, and therefore, it is possible to adjust the light emission chromaticity of the light emitting device 100 towards a shorter wavelength. Furthermore, the light extraction efficiency can be enhanced by mitigation of the change in the refractive index between the air and the translucent member 20, and therefore it is possible to increase the light flux. In this configuration, the nanoparticles 30 for example can be configured to use of a silicon oxide.

As illustrated in FIG. 1, the light emitting device 100 includes the mounting base 50 that is configured to mount the light emitting element 10. The mounting base 50 includes a silver containing coat 60 on the surface. Furthermore, the translucent member 20 covers the silver containing coat 60. In this manner, transmittance of corrosive gases such as sulfur containing gases or the like through the translucent member 20 can be inhibited by the provision of the film 40 on the upper surface of the translucent member 20, and therefore, it is possible to suppress a discoloration in the silver containing coat 60. In particular, since the gas barrier characteristics of the translucent member 20 is enhanced, a configuration in which the nanoparticles 30 are impregnated onto the upper surface side in the base material 25 of the translucent member is more preferred.

As illustrated in FIG. 1, the light emitting device 100 includes an enclosure body 70 configured to enclose the periphery of the translucent member 20 and the light emitting element 10. The film 40 is also provided on the enclosure body 70. In this manner, the film 40 functions as a protective film for the enclosure body 70, and thereby enables suppression of deterioration such as a discoloration or the like of the enclosure body 70.

The adjustment amount of the light emission chromaticity of the light emitting device 100 depends on the content of nanoparticles 30 in the translucent member 20 and the film 40, and preferably exhibits a proportional relationship. Normally, the light emission chromaticity associated with commercial viable product is adjusted so that the difference between the light emission chromaticity of respective light emitting devices becomes smaller or become negligible. As a result, the content of nanoparticles 30 in the translucent member 20 and the film 40 preferably depends on the adjustment amount of the light emission chromaticity of the light emitting device 100.

Second Embodiment

Figure 4:
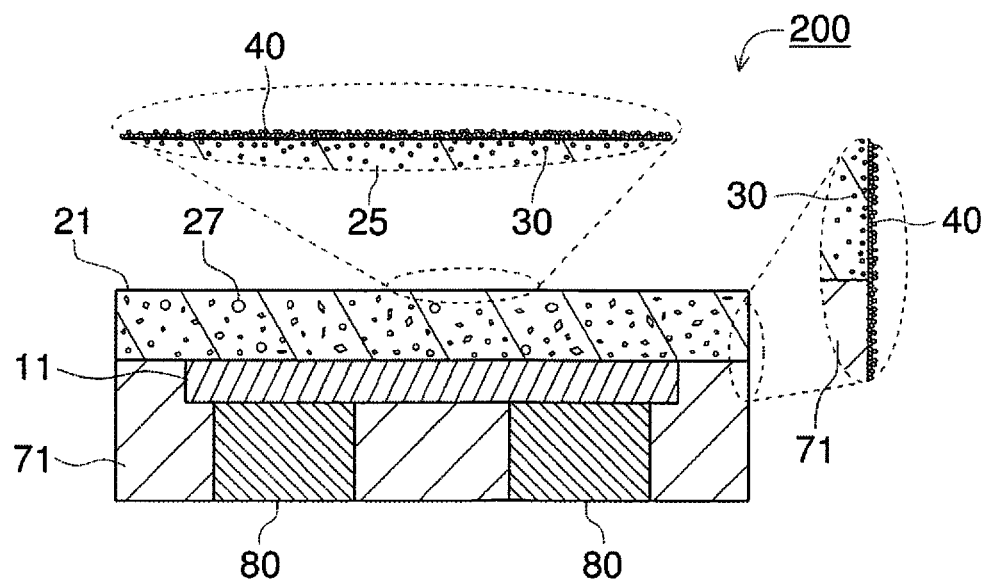
FIG. 4 is a schematic sectional view of a light emitting device according to second embodiment of the present invention.

FIG. 4 is a schematic sectional view of a light emitting device according to a second embodiment. As illustrated in FIG. 4, the light emitting device 200 includes a light emitting element 11, a translucent member 21, and a film 40. The light emitting device 200 does not include a mounting base configured to mount the light emitting element 10. The light emitting device 200 is termed a chip size package (CSP), or the like. The light emitting device 200 includes an enclosure body 71 that is configured to enclose a light emitting element 11. The enclosure body 71 is provided in contact with the lower and the lateral sides of the light emitting element 11. Furthermore, the light emitting device 200 includes a projecting electrode 80 that is connected to the light emitting element 11. The light emitting element 11 emits visible light. The translucent member 21 includes a translucent base material 25. The translucent member 21 includes a fluorescent substance 27, and is provided on the light emitting element 11. The fluorescent substance 27 emits visible light when excited by light emitted from the light emitting element 11. The film 40 is provided on the upper surface of the translucent member 21. The film 40 is configured as an agglutination of nanoparticles 30 that exhibit a different refractive index from the base material 25 of the translucent member.

More specifically, the light emitting element 11 does not include a substrate, and although it is mainly configured by a thin film having the element structure of a semiconductor, the light emitting element 11 can include a substrate. The light emitting element 11 is configured so that positive and negative projecting electrodes 80 are connected to its lower portion. The enclosure body 71 is configured as a resin molded body, and partially covers the light emitting element 11 and the projecting electrode 80. The upper surface of the enclosure body 71 is substantially coplanar with the upper surface of the light emitting element 11, and its lower surface is substantially coplanar with the lower surface of the projecting electrode 80. The translucent member 21 can be tabular or have a thin film configuration, and covers the upper surface of the enclosure body 71 and the upper surface of the light emitting element 11. The base material 25 of the translucent member is a cured resin. The side surface of the enclosure body 71 and the side surface of the translucent member 21 are substantially coplanar, and the film 40 is also provided on these side surfaces.

The light emission chromaticity is also suitably adjusted by the film 40 of the light emitting device 200 having the above configuration. The principle of adjustment of the light emission chromaticity is the same as the configuration described in the first embodiment. Furthermore, the film 40 in the light emitting device 200 can be formed by the processing step described in the first embodiment.

Third Embodiment

Figure 5:
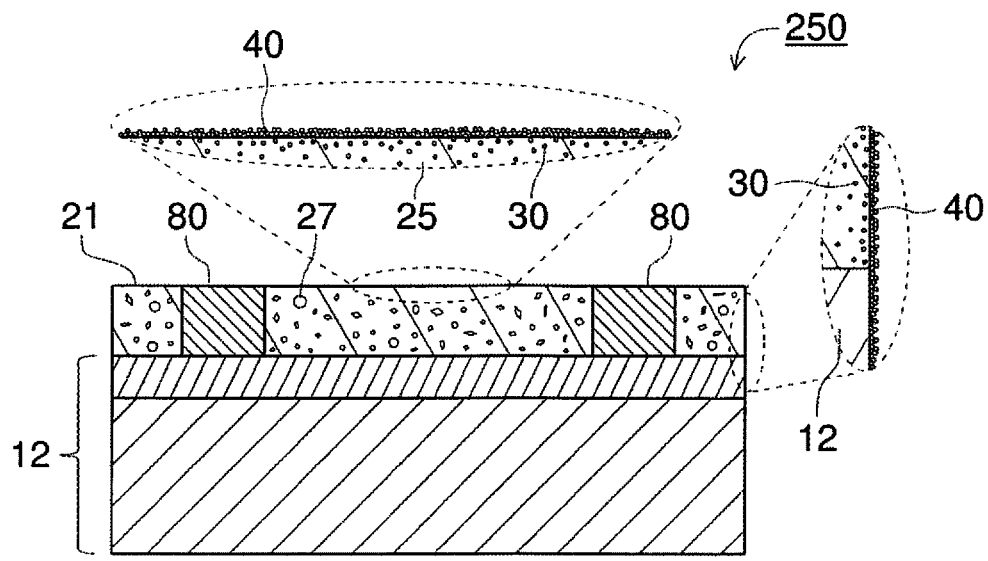
FIG. 5 is a schematic sectional view of a light emitting device according to third embodiment of the present invention.

FIG. 5 is a schematic sectional view of a light emitting device according to a third embodiment. As illustrated in FIG. 5, the light emitting device 250 includes a light emitting element 12, a translucent member 21, and a film 40. The light emitting device 250 does not include a mounting base configured to mount the light emitting element 10 and an enclosure body. The light emitting device 250 is also termed a chip size package (CSP), or the like. The light emitting device 250 includes a projecting electrode 80 that is connected to the light emitting element 12. The light emitting element 12 emits visible light. The translucent member 21 includes a translucent base material 25. The translucent member 21 includes a fluorescent substance 27, and is provided on the light emitting element 12. The fluorescent substance 27 emits visible light when excited by light emitted from the light emitting element 12. The film 40 is provided on the upper surface of the translucent member 21. The film 40 is configured as an agglutination of nanoparticles 30 that exhibit a different refractive index from the base material 25 of the translucent member.

More specifically, a light emitting element 12 includes a conductive substrate, and an element structure of a semiconductor provided thereon. The light emitting element 12 is such that a projecting electrode 80 having either a positive or negative polarity is connected onto the element structure. The translucent member 21 can be tabular or have a thin film configuration, and covers the upper surface of the light emitting element 12. The base material 25 of the translucent member is a cured resin. The upper surface of the translucent member 21 and the upper surface of the projecting electrode 80 are substantially coplanar. The side surfaces of the light emitting element 12 and the translucent member 21 are substantially coplanar, and the film 40 is also provided on these side surfaces.

The light emission chromaticity is also suitably adjusted by the film 40 of the light emitting device 250 having the above configuration. The principle of adjustment of the light emission chromaticity is the same as the configuration described in the first embodiment. Furthermore, the film 40 in the light emitting device 250 can be formed by the processing step described in the first embodiment.

As illustrated in FIG. 5, in a light emitting device 250, the film 40 covers the light emitting element 12. In this manner, the film 40 functions as a protective film for the light emitting element 12, and enables suppression of deterioration of the end face of the semiconductor.

Fourth Embodiment

Figure 6:
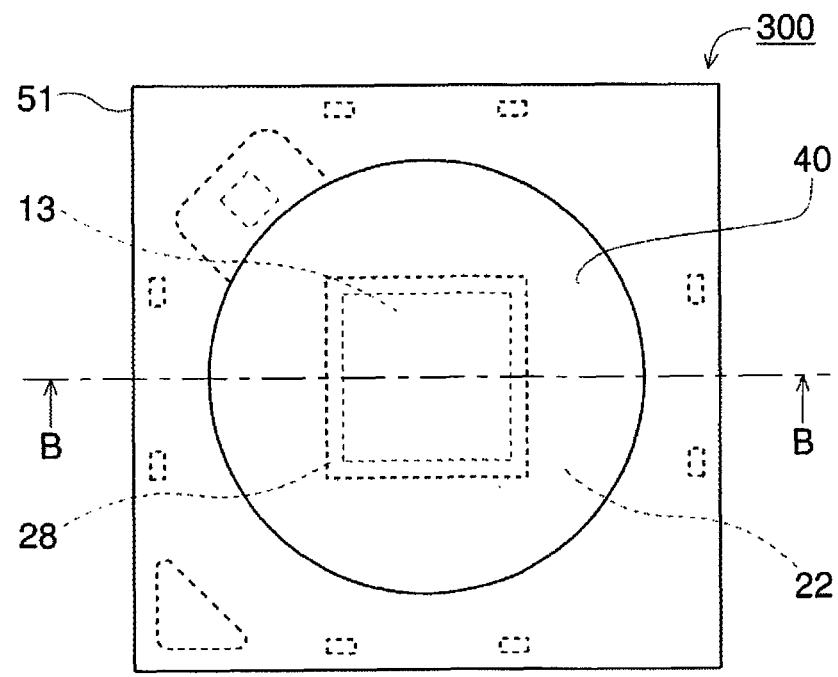
FIG. 6(a) is a schematic upper view of a light emitting device according to a fourth embodiment of the present invention, and 6(b) is a schematic sectional view along the sectional face B-B.
Figure 6:
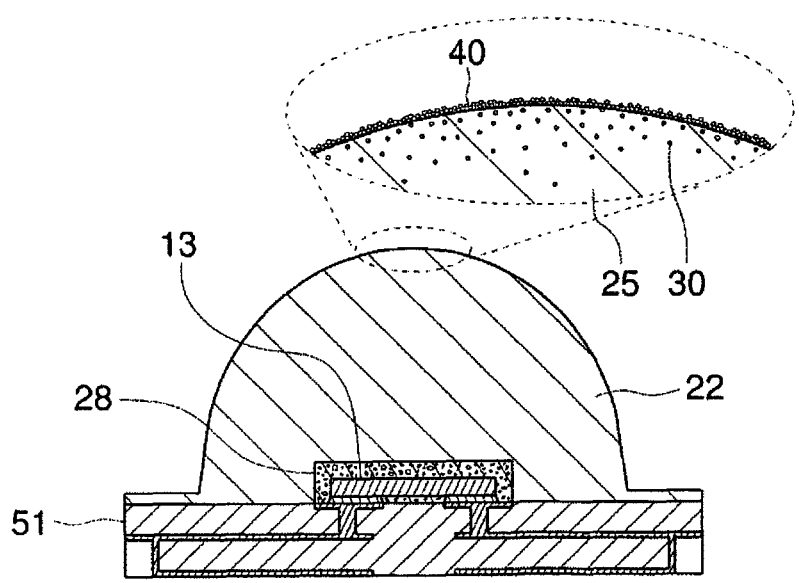

FIG. 6(a) is a schematic upper view of a light emitting device according to a fourth embodiment, and 6(b) is a schematic sectional view along the sectional face B-B in FIG. 6(a). As illustrated in FIG. 6, the light emitting device 300 includes a light emitting element 13, a translucent member 22, and a film 40. Further, the light emitting device 300 includes a mounting base 51 that is configured to mount a light emitting element 13. The light emitting element 13 emits visible light. Fluorescent substances 28 are disposed on the light emitting element 13. The translucent member 22 includes a translucent base material 25. The translucent member 22 is disposed on the light emitting element 13 and the fluorescent substances 28. The fluorescent substances 28 emits visible light when excited by light emitted from the light emitting element 13. The film 40 is provided on the upper surface of the translucent member 22. The film 40 is configured as an agglutination of nanoparticles 30 that exhibit a different refractive index from the base material 25 of the translucent member.

More specifically, the mounting base 51 is configured as a wiring substrate that includes wiring and a substrate. The light emitting element 13 is such that the positive and negative electrodes are connected using a conductive adhesive to the wiring on the upper surface of the respective mounting bases 51. The fluorescent substance 28 can be formulated into the resin, or can be impregnated into the resin. The translucent member 22 covers the upper and side portions of the fluorescent substance 28 and the light emitting element 13, and is provided on the upper surface of the mounting base 51. The translucent member 22 includes a convex portion and a thin film portion. The convex portion is the portion where the upper surface is formed in convex. The thin film portion is the portion where the upper surface is formed in substantially flat and extends along the periphery of the convex portion. The base material 25 of the translucent member is a cured resin. Although the translucent member 22 is configured to substantially not include the fluorescent substance, the fluorescent substance can also be included.

The light emission chromaticity is also suitably adjusted by the film 40 of the light emitting device 300 having the above configuration. The principle of adjustment of the light emission chromaticity is the same as the configuration described in the first embodiment. Furthermore, the film 40 in the light emitting device 300 can be formed by the processing step described in the first embodiment.

Fifth Embodiment

Figure 7:
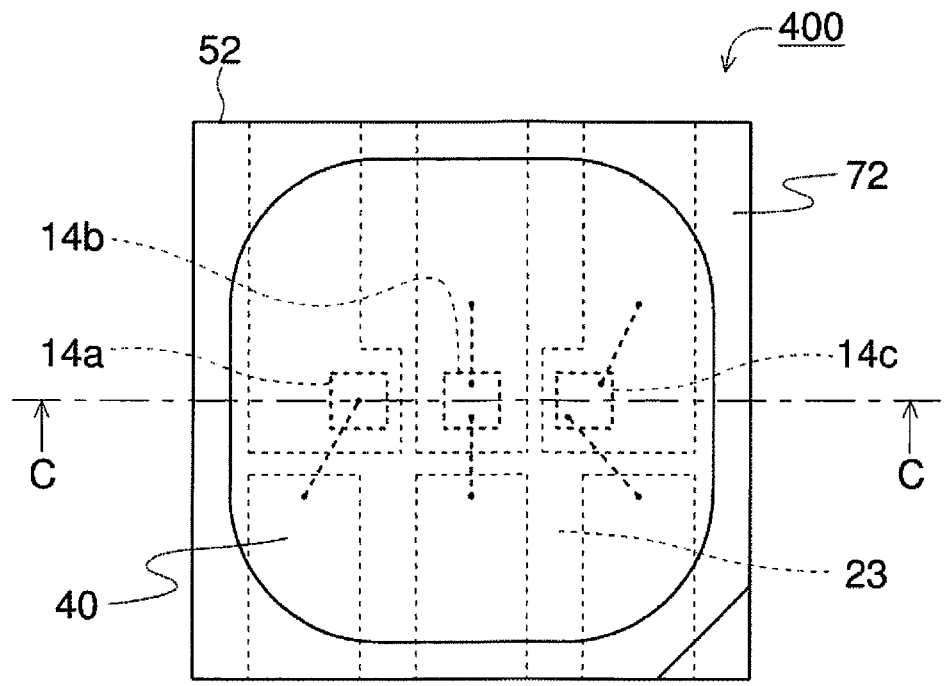
FIG. 7(a) is a schematic upper view of a light emitting device according to a fifth embodiment of the present invention, and 7(b) is a schematic sectional view along the sectional face C-C.
Figure 7:
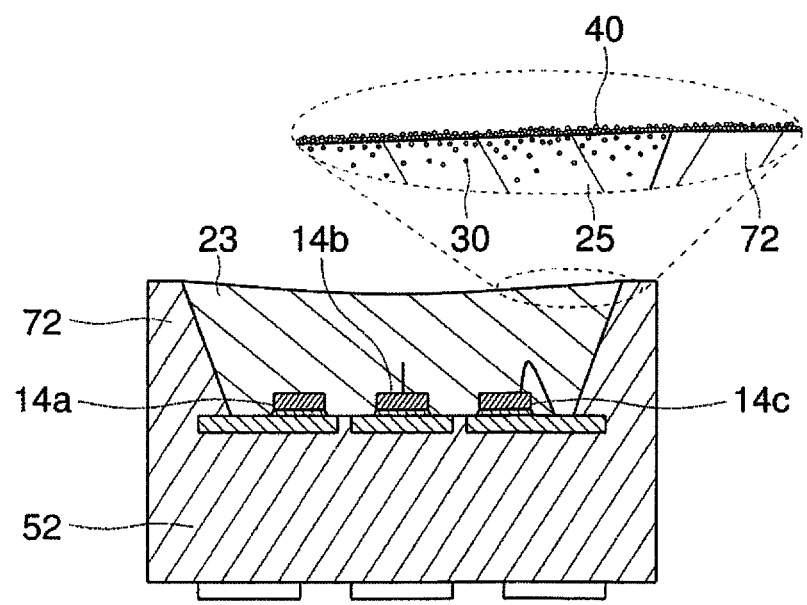

FIG. 7(a) is a schematic upper view of a light emitting device according to a fifth embodiment, and 7(b) is a schematic sectional view along the sectional face C-C in FIG. 7(a). As illustrated in FIG. 7, the light emitting device 400 includes a plurality of light emitting elements 14a, 14b, 14c, a translucent member 23, and a film 40. Further, the light emitting device 400 includes a mounting base 52 that is configured to mount a plurality of light emitting elements 14a, 14b, 14c. The mounting base 52 includes an enclosure body 72. The plurality of light emitting elements 14a, 14b, 14c is respectively configured to emit different colors of light. The translucent member 23 includes a translucent base material 25. The translucent member 23 is provided on a plurality of light emitting elements 14a, 14b, 14c. The film 40 is provided on the upper surface of the translucent member 23. The film 40 is configured as an agglutination of nanoparticles 30 that exhibit a different refractive index from the base material 25 of the translucent member.

More specifically, the mounting base 50 is configured as a package in which a three of a pair of anode and cathode lead frames are integrally retained by the enclosure body 72 that is configured as a resin molded body. A plurality of light emitting elements 14a, 14b, 14c are accommodated in a recessed portion of the enclosure body 72. A plurality of light emitting elements 14a, 14b, 14c are respectively adhered onto one of the lead frames and is connected by a wire with both of the lead frames in a pair of lead frames. The translucent member 20 fills the recessed portion of the enclosure body 70 to thereby cover a plurality of light emitting elements 14a, 14b, 14c. The base material 25 of the translucent member is configured as a cured resin.

The light emission chromaticity is also suitably adjusted by the film 40 of the light emitting device 400 having the above configuration. Further, the film 40 in the light emitting device 400 can be formed by the processing step described in the first embodiment.

(Adjustment Principle of Light Emission Chromaticity)

The principle of adjusting the light emission chromaticity of the light emitting device 400 in the present embodiment can be described for example as disclosed below. Normally, a change in the refractive index of a light to medium (for example, in the band of visible wavelengths) is greater on the short wavelength side than the long wavelength side. In other words, light tends to be affected by a change in the refractive index in short wavelengths rather than in long wavelengths. Consequently, when the refractive index of the film 40 is larger than the refractive index of the base material 25 of the translucent member, the reflected light component of the primary light in the interface between the film 40 and the air becomes greater than that in the interface between the air and the base material 25 of the translucent member. However, the degree of increase is greater towards short wavelengths than towards long wavelengths. Therefore, in this configuration, light emitted from the light emitting device 400 exhibits a relatively high proportion of long wavelength primary light in comparison to short wavelength primary light, and therefore the light emission chromaticity can be adjusted toward a longer wavelength. Conversely, when the refractive index of the film 40 is smaller than the refractive index of the base material 25 of the translucent member, the reflected light component of the primary light in the interface between the film 40 and the air becomes less than that in the interface between the air and the base material 25 of the translucent member. However, the degree of decrease is greater towards short wavelengths than towards long wavelengths. Therefore, in this configuration, light emitted from the light emitting device 400 exhibits a relatively high proportion of short wavelength primary light in comparison to long wavelength primary light, and therefore the light emission chromaticity can be adjusted toward a shorter wavelength.

In the light emitting device 400 illustrated by example in the figures, the translucent member 23 is configured to substantially not include a fluorescent substance. However, the light emitting device according to the present embodiment can be configured to include a fluorescent substance in the translucent member. In this configuration, a combination of the features described in each of the above embodiments is possible to thereby configure an intermediate light emitting device of the first embodiment and the fifth embodiment.

(Constituent Element of Light Emitting Device)

The light emitting device according to the present invention, and the respective constituent elements in a manufacturing method will be described below.

(Light Emitting Element 10, 11, 12, 13, 14a, 14b, 14c)

The light emitting element includes use of a semiconductor light emitting element such as a light emitting diode element (LED), a semiconductor laser element (laser diode (LD)), or the like. The shape of the light emitting element when viewed from above is preferably quadrilateral, and in particular, square or rectangular with a long and short direction. However there is no limitation in relation to the shape. The side surface of the light emitting element can be substantially vertical relative to the upper surface, and can be inclined inward or outward relative to the upper surface. The thickness of the light emitting element for example is at least 0.02 mm to no more than 1 mm, and is preferably least 0.05 mm to no more than 0.5 mm in consideration of the thickness of the light emitting device or the strength of the light emitting element. The light emitting element can be provided with an element structure that is configured by various semiconductors, and a pair of positive and negative electrodes. In particular, the light emitting element is preferably a nitride semiconductor ($In_xAl_yGa_{1-x-y}N$, $0 \leq x$, $0 \leq y$, $x+y \leq 1$) configured to enable efficient excitation of the fluorescent substance. The light emitting element can have a gallium arsenide or gallium phosphide semiconductor configuration that emits green to red light. When the light emitting device is configured to emit white light, and when the color mixing relationship with the wavelength converted light that is emitted from the fluorescent substance is considered, the light emission wavelength of the light emitting element is preferably at least 400 nm and no more than 530 nm, with at least 420 nm and no more than 490 nm being still more preferred. The light emitting element normally has a substrate which the element structure is provided on. The substrate can be a substrate for a crystal growth configured to enable growth of a semiconductor crystal that forms the element structure, or can be a substrate for bonding configured to bond to the element structure that is separated from the substrate for the crystal growth. The base material of the substrate for the crystal growth includes sapphire, spinel, gallium nitride, aluminum nitride, silicon, silicon carbide, gallium arsenide, gallium phosphide, indium phosphide, zinc sulfide, zinc oxide, zinc selenide, diamond or the like. The base material of the substrate for bonding includes silicon, silicon carbide, aluminum nitride, copper, copper-tungsten or the like. However the substrate can be omitted. When using a light emitting element provided with the pair of positive and negative electrodes on the same surface, the mounting configuration can be a face-up mounting in which the electrodes are connected with the conductive member of the mounting substrate with a wire, or can be a face-down (flip chip) mounting in which the electrodes are connected with the conductive member of the mounting substrate by a conductive adhesive. When using a light emitting element having an opposed electrode structure in which the pair of positive and negative electrodes is provided respective on mutually opposed surfaces, the lower surface electrode is connected to the conductive member of the mounting substrate with a conductive adhesive, and the upper surface electrode is connected to the conductive member of the mounting substrate with a wire. The light extraction efficiency can be enhanced by provision of a dielectric reflecting film or metal layer such as silver or aluminum, or the like on the mounting surface side of the light emitting element. One or a plurality of light emitting elements can be mounted on a single light emitting device, and the size or shape, and the light emission wavelength can be arbitrarily selected. For example, light emitting elements configured to emit a red, green, blue light can be mounted on a single light emitting device. The plurality of light emitting elements can be arranged in an irregular configuration, or can have a regular or cyclical configuration such as an array, a concentric arrangement or the like in order to obtain a preferred luminous intensity distribution. Furthermore, the plurality of light emitting elements is connected in series or parallel by a wire or conductive member of the mounting substrate.

(Translucent Member 20, 21, 22, 23)

The translucent member is a member that is provided on the light emitting element and is configured to enable transmission of light from the light emitting element and/or the fluorescent substance. The translucent member includes at least a translucent base material, and can include the fluorescent substance in the base material. The translucent member can be provided in connection with the light emitting element, and can be separated from the light emitting element. The translucent member for example can be configured as a sealing member, or as a tabular-shaped or various types of lens-shaped window members.

(Base Material 25)

The base material of the translucent member is preferably configured from a thermosetting resin. In particular, when the glass transition temperature is less than or equal to ambient temperature, the base material is soft at ordinary temperatures, and exhibits a tendency for the nanoparticles to impregnate the translucent member. The base material of the translucent member preferably uses a silicon-containing resin, an epoxy resin such as a triazine derivative-epoxy resin or the like. The silicon-containing resin usually includes a composition of one or in combination of 2 or more of a soft or hard epoxy resin, a hard silicone resin, an epoxy-modified silicone resin, modified silicone resin. Also, another epoxy resin, silicone resin, urethane resin, fluorine resin and the like can be used.

(Fluorescent Substance 27, 28)

The fluorescent substance absorbs at least a part of the primary light emitted from the light emitting element, and thereby emits a secondary light that has a wavelength that is different from the primary light. In this manner, a light emitting device can be configured that emits a mixed color light (for example, white light) being a mixture of primary light and second light at visible wavelengths. Examples of the fluorescent substance include a nitride-based and oxynitride-based fluorescent substances activated mainly with lanthanoid element such as europium, cerium, etc., more specifically, an α- or β-sialon and alkali earth nitride silicate fluorescent substances activated with europium; an alkali earth metal halogen apatite, alkali earth metal halosilicate, alkali earth metal silicate, alkali earth metal borate halogen, alkali earth metal aluminate, alkali earth metal silicate, alkali earth metal sulfide, alkali earth thiogallate, alkali earth metal nitride silicate and germanate fluorescent substances activated mainly with lanthanoids such as Eu or transition metal elements such as Mn; an rare earth aluminates and rare earth silicates activated mainly with lanthanoid elements such as Ce; an organic compound and organic complex activated mainly with a lanthanoid element such as Eu, etc. Also, fluorescent substance which has the same properties and effects as the above can be used. The fluorescent substance can be eccentrically disposed towards the recessed portion bottom surface or the light emitting element, or can be dispersed in the recessed portion.

(Nanoparticles 30, Film 40)

The nanoparticles are preferably formed from silicon oxide (silica), aluminum oxide (alumina), aluminum nitride, magnesium oxide, antimony oxide, titanium oxide, zirconium oxide, calcium oxide, boric acid, zinc oxide, cerium oxide, indium oxide, tin oxide, aluminum hydroxide, magnesium hydroxide, barium sulfate, magnesium carbonate, barium carbonate, calcium silicate, barium titanate, diamond, talc, kaolin, mica, clay minerals, gold, silver or the like. The light emission chromaticity is shifted towards a long wavelength by use of a material that exhibits a high refractive index, and for example, is preferably titanium oxide. Furthermore, the light emission chromaticity is shifted towards a short wavelength and the light flux can be enhanced by use of a material that exhibits a low refractive index, and for example, is preferably a silicon oxide. However, there is no limitation in relation to the nanoparticles, and if required, combined use of another type of material is possible. The shape of the nanoparticles can be spherical, polygonal, needle shape, tabular, or the like. A configuration of the nanoparticles in a needle or tabular shape enhances the gas barrier performance of the translucent member.

(Mounting Base 50, Silver-Containing Coat 60)

The mounting base is a member forming the pedestal used for mounting of the light emitting element. The mounting base is configured mainly by a conductive member for supplying power to the light emitting element, and a base material for retaining the conductive member. The mounting base for example includes a package configuration that has a lead frame and a molded body, or a configuration as a wiring substrate that includes a substrate and wiring. Furthermore, the mounting base can be manufactured to include wiring formed from metal plating or the like that is applied after formation of the molded body, or laminated using a thin plate provided in advance with wiring. The mounting base can be formed as a flat plate that is not provided with a recessed portion (side wall), in addition to a configuration provided with a recessed portion (cup portion). A configuration that includes a recessed portion tends to enhance the luminosity in front device, and the flat plate shaped configuration facilitates mounting of the light emitting element. The shape of the element mounting surface of the mounting base includes for example a rectangular shape, a polygonal shape, a race-track shape (a shape having a semicircle provided on both sides of a rectangle), a circular shape, an oval shape, or the like. The element mounting surface of the mounting base can be formed so that a portion thereof has an increased diameter in proximity to the site of mounting of the light emitting element.

The base material of the lead frame includes copper, iron, nickel, palladium, tungsten, chromium, aluminum, silver, gold, titanium or an alloy thereof. In particular, from the point of view of thermal radiation properties, copper or a copper alloy are preferred, and from the point of view of bonding reliability with the light emitting element, iron or an iron alloy are preferred. Of those configurations, copper or copper containing iron is preferred due to superior thermal radiation properties. The lead frame can be manufactured by execution of processing steps such as pressing, etching, or the like of these metal plates. Furthermore, a coat of silver, nickel, palladium, platinum, tin, gold, copper, rhodium or an alloy thereof, or silver oxide or oxide of silver alloy, or the like can be formed on the surface of the lead frame. In particular, the surface of the site of bonding of the lead frame with the light emitting element can be covered with silver. These coats can be formed by plating, deposition, sputtering, printing, coating, or the like.

The base material of the molded body includes thermoplastic resins such as aliphatic polyamide resins, semi-aromatic polyamide resins, polyethylene terephthalate, polycyclohexane terephthalate, liquid crystal polymers, polycarbonate resins, syndiotactic polystyrene, polyphenylene ether, polyphenylene sulfide, polyether sulfone resins, polyether ketone resins and polyarylate resins, and thermosetting resins such as polybismaleimide triazine resins, epoxy resins, silicone resins, silicone-modified resins, polyimide resins, and polyurethane resins. The base material can include particles or fibers of a filler, colorant or pigment such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black, or the like. The molded body can also be formed of glass or ceramics. As a molding method of the molded body, insert molding, injection molding, extrusion molding and transfer molding can be used.

The wiring is formed at least on the upper surface of the substrate, and can be also formed on the lower surface, the side surface and the inner portion of the substrate. Furthermore, the wiring can include a land (die pad) portion that is bonded with the light emitting element, an outer connection terminal portion, and a retractable wiring portion or the like that is configured to connect the land portion and the terminal portion. The material used in the wiring includes copper, nickel, palladium, tungsten, chromium, titanium, aluminum, silver, gold or an alloy thereof. In particular, from the point of view of thermal radiation properties, copper, or a copper alloy is preferred. Furthermore, a coat of silver, platinum, tin, gold, copper, rhodium or an alloy thereof, or silver oxide or oxide of silver alloy, or the like can be formed on the surface of the wiring. In particular, the surface of the site of bonding of the wiring with the light emitting element can be covered with silver. The coats or wiring can be formed by a cofiring method, a post-firing method, plating, deposition, sputtering, printing, coating, or the like.

The base material of the substrate can be configured with electrical insulating properties, or when the base material is conductive, electrical insulation from the wiring is enabled through use of an insulating film or the like. The base material of the substrate includes ceramics such as aluminum oxide, aluminum nitride, zirconium oxide, zirconium nitride, titanium oxide, titanium nitride or a mixture thereof, metals such as copper, iron, nickel, chromium, aluminum, silver, gold, titanium and alloys thereof, or resins such as epoxy resins, BT resins, polyimide resins or fiber-reinforced resins thereof (reinforcing material such as alumina or glass). A pliable substrate (flexible substrate) can also be used. The resin for the base material can include a composition of a white pigment such as titanium oxide or the like in order to enable efficient reflection of light from the light emitting element.

(Enclosure Body 70, 71)

The enclosure body is a member that is configured to enclose the periphery (the sides) of the light emitting element. The enclosure body includes a configuration of a frame body provided on the wiring substrate, a configuration of a covering member to directly cover the light emitting element, a configuration of a package molded body, or the like. The enclosure body can be configured by use of the same material as the molded body described above. In particular, the enclosure body is preferably configured by a light reflecting resin, such as a white resin, or the like.

(Projecting Electrode 80)

The projecting electrode is an outer connection electrode that is connected electrically with the electrode of the light emitting element, and is connected with the outer wiring. The projecting electrode for example includes a so-called bump. The projecting electrode includes use of a single layer film of gold, copper, nickel, palladium, silver or an alloy that includes such metals, or a multilayered film of those metals. Although gold is preferred due to low electrical resistance and contact resistance, use is also possible of an AuSn alloy that is an alloy using cost-effective tin. When configured as a single layer, the projecting electrode can be formed by a wire bonder using wiring configured from the above materials. When the projecting electrode has a single layer or multilayered structure, formation is possible using a plating processing such as electrolytic plating or non-electrolytic plating.

(Fluid Dispersion 90)

The solution in which the nanoparticles are dispersed include, for example, ethanol, isopropyl alcohol, toluene, hexane, propanol, petroleum benzin, gasoline, xylene, benzene, carbon tetrachloride, 1,1,1-trichloroethane, 1,2-dichloroethylene, trichlorethylene, tetrachlorethylene, dichloromethane, chloroform, methanol, ethyl ether, acetone, methyl ethyl ketone, methyl isobutyl ketone, cyclohexanone, methyl acetate, ethyl acetate, butyl acetate, methyl cellosolve, ethyl cellosolve, carbon disulfide, acetonitrile, diethylamine, nitrobenzene, tetrahydrofuran, dimethylformamide, N-methylpyrrolidone, and the like. In particular, use of a solution that exhibits a swelling action in relation to the base material of the translucent member facilitates impregnation of the nanoparticles into inner portion of the base material of the translucent member.

EXAMPLES

The examples of the present invention will be described in detail below. It goes without saying that the present invention is not limited only to the examples described below.

Example 1

The light emitting device in Example 1 is an SMD-style and side-emission type LED configured with the structure illustrated in the example illustrated in FIG. 1, and having an outer shape having a vertical dimension (thickness when mounted) of 0.8 mm, a horizontal dimension of 2.8 mm, a thickness of 1.0 mm.

The mounting base has two lead frames and an enclosure body configured as a resin molded body to integrally retain the lead frames, and is configured as a package that includes a recessed portion disposed in substantially the center of the upper surface of the mounting base with height dimension of 0.66 mm, width 2.2 mm and depth 0.3 mm. The two lead frames are formed from a copper alloy in which silver plating is applied to the surface of the lead frames. A portion thereof is configured as the recessed portion bottom surface, and extends to outside of the enclosure body. The enclosure body is formed from a polyphthalamide resin that contains titanium oxide and wollastonite.

The light emitting element is a light emitting diode chip having a substantially rectangular parallelepiped configuration with height of 0.3 mm, width of 0.7 mm and thickness of 0.1 mm to enable emission of blue light (central wavelength 460 nm) and in which an n-layer, active layer and p-layer are laminated in sequence as a nitride semiconductor on the sapphire substrate. The electrode of the light emitting element is provided on the upper surface side (semiconductor layer side), and includes a pad electrode for bonding and an extension electrode that extends from the pad electrode. The light emitting element is connected by an adhesive configured as a translucent silicon resin onto one of the lead frames (cathode side) in the recessed portion of the mounting base, and the respective pad electrodes are respectively connected with the lead frames of the anode and cathode by a metal wire.

The translucent member is filled into the recessed portion of the mounting base to cover the wire and the light emitting element. The upper surface of the translucent member has a substantially coplanar configuration with the upper surface of the enclosure body (slightly recessed surface due to shrinkage during curing). The translucent member is configured from a base material being a soft silicon resin having a refractive index of 1.52 at a wavelength of 589 nm, and containing a YAG:Ce fluorescent substance. The fluorescent substance is dispersed above and around the light emitting element in the base material of the translucent member.

The film having a thickness of 50 nm to 1 micron which is configured as an agglutination of nanoparticles is provided on the upper surface of the translucent member. The nanoparticles are titanium oxide having a center particle diameter of 36 nm and a refractive index of 2.62 at a wavelength of 589 nm. Furthermore, the film is also provided on the mounting base. The film is formed by drying after immersion for about 10 seconds of the work in process of the light emitting device in a fluid dispersion (0.1 to 0.4 wt % concentration of nanoparticles) in which the nanoparticles are dispersed in a solvent of toluene.

Example 2

The light emitting apparatus in Example 2 is manufactured in the same manner as the light emitting device in Example 1 with the exception that the nanoparticles are configured as silicon oxide that exhibits a refractive index at a wavelength of 589 nm of 1.46, and has a central particle diameter of 25 nm.

Evaluation 1

The light emitting device according to Example 1 enables confirmation of a light flux maintenance efficiency of 99%, and a yellow shift in relation to light emission chromaticity when compared before and after film formation. Furthermore, the light emitting device according to Example 2 enables confirmation of a light flux maintenance efficiency of 101%, and a blue shift in relation to light emission chromaticity when compared before and after film formation.

Evaluation 2

Testing performed by immersion of the light emitting device according to Examples 1 and 2 in IPA in order to confirm whether particle detachment occurs in response to sustained rocking and washing in a solvent enables confirmation of no change in the outer appearance of the light emitting device according to Examples 1 and 2, and no change in the light emission chromaticity, and therefore of almost no particle detachment. Furthermore, testing by placement of about 100 of the light emitting device according to Examples 1 and 2 in a container, followed by shaking to bring the light emitting devices into contact with each other to thereby confirm whether particle detachment occurs in response to an external physical force enables confirmation of no change in the outer appearance of the light emitting device according to Examples 1 and 2, and no change in the light emission chromaticity, and therefore of almost no particle detachment.

Evaluation 3

Testing to confirm sulfur resistance of the light emitting device according to Examples 1 and 2 enables confirmation of little reduction in the light flux and effectiveness in relation to sulfur resistance in comparison to a light emitting device that lacks formation of a film.

INDUSTRIAL APPLICABILITY

The light emitting device according to the present invention can be used for back light sources for liquid crystal displays; various kinds of lighting apparatus; large-size displays; various kinds of displays for advertising, direction information guide and the like; image scanners such as digital video camera, facsimile, coping machine, scanner; projector apparatus and the like.

It is to be understood that although the present invention has been described with regard to preferred embodiments thereof, various other embodiments and variants can occur to those skilled in the art, which are within the scope and spirit of the invention, and such other embodiments and variants are intended to be covered by the following claims.

What is claimed is:

1. A light emitting device comprising:
a light emitting element configured to emit visible light;
a fluorescent substance excited by light from the light emitting element and configured to emit visible light;
a translucent member containing a translucent base material, which provided on the fluorescent substance or configured to contain the fluorescent substance, and provided on the light emitting element; and
a film provided on an upper surface of the translucent member, the film including a layer configured as an agglutination of nanoparticles alone, the agglutination of the nanoparticles covering the translucent member on an entirety of the upper surface of the translucent member, the nanoparticles having a different refractive index from the base material, the nanoparticles being formed from one of silicon oxide, aluminum oxide, aluminum nitride, magnesium oxide, antimony oxide, titanium oxide, zirconium oxide, calcium oxide, boric acid, zinc oxide, cerium oxide, indium oxide, tin oxide, aluminum hydroxide, magnesium hydroxide, barium sulfate, magnesium carbonate, barium carbonate, calcium silicate, barium titanate, diamond, talc, kaolin, mica, clay minerals, gold and silver.

2. The light emitting device according to claim 1, wherein the nanoparticles include particles having a particle diameter of 1 nm to 100 nm.

3. The light emitting device according to claim 2, wherein additional nanoparticles are impregnated into the base material.

4. The light emitting device according to claim 2, wherein a particle diameter of the nanoparticles is configured to cause Rayleigh scattering of light from the light emitting element.

5. The light emitting device according to claim 1, wherein a refractive index of the nanoparticles is greater than a refractive index of the base material.

6. The light emitting device according to claim 1, wherein a refractive index of the nanoparticles is smaller than a refractive index of the base material.

7. The light emitting device according to claim 1, further comprising
a mounting base configured to mount the light emitting element, and including a silver containing coat on a surface thereof; and
the translucent member covering the silver containing coat.

8. The light emitting device according to claim 1, further comprising
an enclosure body configured to enclose the periphery of the translucent member and the light emitting element, and
the film provided on the enclosure body.

9. The light emitting device according to claim 1, wherein the film covers the light emitting element.

10. The light emitting device according to claim 1, wherein
contents of the nanoparticles of the film depend on an adjustment amount of the light emission chromaticity of the light emitting device.

11. The light emitting device according to claim 3, wherein
a refractive index of the nanoparticles of the film is greater than a refractive index of the base material.

12. The light emitting device according to claim 11, further comprising
a mounting base configured to mount the light emitting element, and including a silver containing coat on a surface thereof; and
the translucent member covering the silver containing coat.

13. The light emitting device according to claim 12, further comprising
an enclosure body configured to enclose the periphery of the translucent member and the light emitting element, and
the film provided on the enclosure body.

14. The light emitting device according to claim 13, wherein
contents of the nanoparticles of the film and the additional nanoparticles in the base material depend on an adjustment amount of the light emission chromaticity of the light emitting device.

15. A method of manufacturing a light emitting device, the device comprising:
a light emitting element configured to emit visible light;
a fluorescent substance excited by light from the light emitting element and configured to emit visible light,
a translucent member containing a translucent base material, which provided on the fluorescent substance or configured to contain the fluorescent substance, and provided on the light emitting element; the method comprising;

forming a film on an upper surface of the translucent member, the film including a layer configured as an agglutination of nanoparticles alone, the nanoparticles having a different refractive index from the base material, the nanoparticles being formed from one of silicon oxide, aluminum oxide, aluminum nitride, magnesium oxide, antimony oxide, titanium oxide, zirconium oxide, calcium oxide, boric acid, zinc oxide, cerium oxide, indium oxide, tin oxide, aluminum hydroxide, magnesium hydroxide, barium sulfate, magnesium carbonate, barium carbonate, calcium silicate, barium titanate, diamond, talc, kaolin, mica, clay minerals, gold and silver, wherein the forming of the film includes forming the film by immersion of the upper surface of the translucent member into a fluid dispersion in which particles are dispersed into volatile liquid, or by coating the fluid dispersion in which nanoparticles are dispersed into volatile liquid onto the upper surface of the translucent member, and the formation of the film is carried out after provision of the translucent member onto the light emitting element.

16. The method of manufacturing a light emitting device according to claim 15, the device further comprising:

an enclosure body configured to enclose the periphery of the translucent member and the light emitting element, and the method further comprising:

forming the film on the enclosure body by immersion of the enclosure body into a fluid dispersion in which nanoparticles are dispersed into volatile liquid, or by coating the fluid dispersion in which nanoparticles are dispersed into volatile liquid onto the enclosure body.

17. The method of manufacturing a light emitting device according to claim 15, wherein the nanoparticles include particles having a particle diameter of 1 nm to 100 nm.

18. The method of manufacturing a light emitting device according to claim 15, further comprising:

measuring the chromaticity of the light emitted from the translucent member before the forming the film; and determining contents of nanoparticles in the light emitting device based on a difference between a desired chromaticity and the measured chromaticity.

19. A method of manufacturing a light emitting device, the device comprising:

a light emitting element configured to emit visible light;

a fluorescent substance excited by light from the light emitting element and configured to emit visible light; and a translucent member containing a translucent base material, which provided on the fluorescent substance or configured to contain the fluorescent substance, and provided on the light emitting element;

the method comprising:

forming a film on an upper surface of the translucent member, the film including a layer configured as an agglutination of nanoparticles alone, the nanoparticles having a different refractive index from the base material, the nanoparticles being formed from one of silicon oxide, aluminum oxide, aluminum nitride, magnesium oxide, antimony oxide, titanium oxide, zirconium oxide, calcium oxide, boric acid, zinc oxide, cerium oxide, indium oxide, tin oxide, aluminum hydroxide, magnesium hydroxide, barium sulfate, magnesium carbonate, barium carbonate, calcium silicate, barium titanate, diamond, talc, kaolin, mica, clay minerals, gold and silver;

measuring the chromaticity of the light emitted from the translucent member before the forming the film; and determining contents of nanoparticles in the light emitting device based on a difference between a desired chromaticity and the measured chromaticity.

* * * * *